United States Patent
Naruse et al.

(10) Patent No.: US 10,224,173 B2
(45) Date of Patent: Mar. 5, 2019

(54) OBJECTIVE LENS AND TRANSMISSION ELECTRON MICROSCOPE

(71) Applicant: JEOL Ltd., Tokyo (JP)

(72) Inventors: Tatsuo Naruse, Tokyo (JP); Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/710,091

(22) Filed: Sep. 20, 2017

(65) Prior Publication Data
US 2018/0130633 A1 May 10, 2018

(30) Foreign Application Priority Data

Sep. 21, 2016 (JP) .................................. 2016-183961

(51) Int. Cl.
*H01J 37/141* (2006.01)
*H01J 37/26* (2006.01)

(52) U.S. Cl.
CPC .............. *H01J 37/141* (2013.01); *H01J 37/26* (2013.01); *H01J 2237/04922* (2013.01); *H01J 2237/1405* (2013.01); *H01J 2237/24564* (2013.01); *H01J 2237/2802* (2013.01)

(58) Field of Classification Search
CPC ......................... H01J 37/141; H01J 2237/2802
See application file for complete search history.

(56) References Cited

U.S. PATENT DOCUMENTS

| | | | | | |
|---|---|---|---|---|---|
| 3,008,044 | A | * | 11/1961 | Buchhold | H01F 6/00 250/311 |
| 3,660,657 | A | * | 5/1972 | Brookes | H01J 37/04 250/311 |
| 3,708,772 | A | * | 1/1973 | Le Franc | H01J 37/1416 250/396 ML |
| 4,097,739 | A | * | 6/1978 | Muller | H01J 37/141 250/311 |

(Continued)

FOREIGN PATENT DOCUMENTS

| | | | | |
|---|---|---|---|---|
| CN | 104916516 A | | 9/2015 | |
| JP | 57151159 A | * | 9/1982 | ............ H01J 37/141 |

(Continued)

OTHER PUBLICATIONS

European Search Report dated Jul. 4, 2018 in EP application No. 17191913.

*Primary Examiner* — Michael J Logie
(74) *Attorney, Agent, or Firm* — The Webb Law Firm

(57) ABSTRACT

There is provided an objective lens capable of reducing the effects of magnetic fields on a sample. The objective lens includes a first lens and a second lens. The lenses are arranged so that the component of the magnetic field of the first lens lying along the optical axis and the component of the magnetic field of the second lens lying along the optical axis cancel out each other at a sample placement surface. The first and second lenses each include an inner polepiece and an outer polepiece. The inner polepieces have front end portions, respectively. The outer polepieces have front end portions, respectively, which jut out toward the optical axis.

(Continued)

The distances of the front end portions of the outer polepieces, respectively, from the sample placement surface are less than the distances of the front end portions of the inner polepieces, respectively, from the sample placement surface.

14 Claims, 5 Drawing Sheets

(56) References Cited

U.S. PATENT DOCUMENTS

| | | | | |
|---|---|---|---|---|
| 4,633,085 A * | 12/1986 | Tomita | ............ | H01J 37/26 250/310 |
| 5,051,585 A * | 9/1991 | Koshishiba | ............ | G03F 1/86 250/310 |
| 5,981,947 A * | 11/1999 | Nakasuji | ............ | H01J 37/244 250/310 |
| 6,452,175 B1 * | 9/2002 | Adamec | ............ | H01J 37/1478 250/310 |
| 2005/0236568 A1 * | 10/2005 | Buijsse | ............ | H01J 37/143 250/310 |
| 2005/0274889 A1 | 12/2005 | Shindo et al. | | |
| 2009/0159810 A1 * | 6/2009 | Knippelmeyer | ...... | H01J 37/141 250/396 ML |
| 2009/0206258 A1 * | 8/2009 | Kasai | ............ | H01J 37/141 250/311 |
| 2010/0163742 A1 * | 7/2010 | Watanabe | ............ | G01T 1/2928 250/370.15 |
| 2010/0252735 A1 * | 10/2010 | Hytch | ............ | H01J 37/26 250/311 |
| 2010/0294932 A1 * | 11/2010 | Tomita | ............ | H01J 37/147 250/311 |
| 2014/0361167 A1 * | 12/2014 | Morishita | ............ | H01J 37/244 250/310 |
| 2015/0311029 A1 * | 10/2015 | Yamazaki | ............ | H01J 37/141 250/311 |
| 2016/0042910 A1 * | 2/2016 | Chang | ............ | H01J 37/1413 250/311 |
| 2016/0148782 A1 * | 5/2016 | Agemura | ............ | H01J 37/244 250/310 |
| 2017/0040139 A1 * | 2/2017 | Nomaguchi | ............ | H01J 37/04 |

FOREIGN PATENT DOCUMENTS

| | | | |
|---|---|---|---|
| JP | 63298947 A | 12/1988 | |
| JP | 06283128 A * | 10/1994 | ............ H01J 37/20 |
| JP | 8321272 A | 12/1996 | |
| JP | 200532588 A | 2/2005 | |
| JP | 2005032588 A * | 2/2005 | ............ H01J 37/141 |
| JP | 5953314 B2 | 6/2016 | |

* cited by examiner

OBJECTIVE LENS AND TRANSMISSION ELECTRON MICROSCOPE

BACKGROUND OF THE INVENTION

Field of the Invention

The present invention relates to an objective lens and transmission electron microscope.

Description of Related Art

In transmission electron microscopy, a magnetic objective lens is known as an objective lens for focusing and imaging an electron beam. Magnetic objective lenses have been so improved that the focal distances of the lenses are reduced by generating a strong magnetic field in or near a sample.

However, where a sample that is sensitive to a magnetic field such as a magnetic sample is observed with a transmission electron microscope, there is the problem that the magnetic field produced by the objective lens varies the magnetic characteristics of the sample. If the magnetic field of the objective lens is placed at a distance remote from the sample in order to protect the sample from the effects of the magnetic field, the focal distance of the objective lens is increased. This will degrade the resolution of the electron microscope. Accordingly, it has been difficult to observe a magnetic sample appropriately at high resolution using an objective lens of the electromagnetic type.

Furthermore, a Lorentz force (Maxwell stress) exerted by the magnetic field of an objective lens acts on a magnetic sample in such a way as to pull the sample toward the objective lens. This makes it difficult to hold the magnetic sample at a given position of observation.

As regards this problem, the objective lens set forth in JP-A-2005-32588 is so designed that magnetic fields produced respectively by first and second electromagnetic lenses cancel each other out to zero in the region where a sample is placed. More specifically, the magnetic fields are produced symmetrically with respect to the sample placement surface by the first and second electromagnetic lenses such that the magnetic field component at the position of the origin of the sample which is in the vertical direction (i.e., in a direction along the optical axis) is prevalent. In addition, the vertical components of the magnetic fields respectively produced from the two lenses cancel out each other at the position of the origin of the sample. Consequently, the magnetic field at the position of the origin of the sample is made substantially zero in strength.

In this objective lens, the magnetic field strength in the region where the sample is placed can be substantially made zero and, therefore, a magnetic sample can be observed without varying its magnetic characteristics. Furthermore, in this objective lens, it is possible to prevent the magnetic sample from being drawn toward the objective lens by a Lorentz force.

In the objective lens disclosed in JP-A-2005-32588, the magnetic field strength at the position of the origin of the sample where the optical axis and the sample placement surface intersect each other can be made substantially zero. However, at positions lying off the position of the origin of the sample, the horizontal components of the magnetic fields (which are perpendicular to the optical axis) produced by the first and second electromagnetic lenses do not cancel out each other but rather combine additively at some locations. Consequently, in the objective lens disclosed in JP-A-2005-32588, the sample may be affected by the effects of horizontal magnetic fields.

SUMMARY OF THE INVENTION

The present invention has been made in view of the foregoing problem. One object associated with some aspects of the present invention is to provide an objective lens which can lessen the effects of magnetic fields on a sample and which permits the sample to be observed at high resolution. Another object associated with some aspects of the invention is to provide an electron microscope including this objective lens.

(1) An objective lens associated with the present invention is for use in a transmission electron microscope and includes a first electromagnetic lens and a second electromagnetic lens which are arranged along an optical axis and on opposite sides of a sample placement surface on which a sample is placed. The first and second electromagnetic lenses produce their respective magnetic fields having components lying along the optical axis. The first and second electromagnetic lenses are so arranged that the component of the magnetic field of the first electromagnetic lens lying along the optical axis and the component of the magnetic field of the second electromagnetic lens lying along the optical axis cancel out each other at the sample placement surface. Each of the first and second electromagnetic lenses has an inner polepiece and an outer polepiece. The inner polepiece has a front end portion. The outer polepiece has a front end portion that juts out toward the optical axis. The distance between the front end portion of the outer polepiece and the sample placement surface is less than the distance between the front end portion of the inner polepiece and the sample placement surface.

In this objective lens, the component of the magnetic field of the first electromagnetic lens lying along the optical axis and the component of the magnetic field of the second electromagnetic lens lying along the optical axis cancel out each other at the sample placement surface and, therefore, the magnetic field at the sample placement surface lying along the optical axis can be reduced in strength.

Furthermore, in this objective lens, the distance between the front end portion of the outer polepiece and the sample placement surface is less than the distance between the front end portion of the inner polepiece and the sample placement surface. The front end portion of the outer polepiece juts out toward the optical axis. Hence, the magnetic fields produced by the first and second electromagnetic lenses can be prevented from leaking to the vicinity of the sample. As a result, the magnetic field components perpendicular to the optical axis can be reduced in strength over a wide area around the sample.

Therefore, in this objective lens, the effects of the magnetic fields on the sample can be reduced. If the sample is sensitive to magnetic fields, the sample can be observed at high resolution.

(2) In one feature of the objective lens of (1) above, the first electromagnetic lens and the second electromagnetic lens may be arranged symmetrically with respect to a virtual plane that contains the sample placement surface.

In this objective lens, the component of the magnetic field of the first electromagnetic lens lying along the optical axis and the component of the magnetic field of the second electromagnetic lens lying along the optical axis can be easily made to cancel out each other at the sample placement surface.

(3) In one feature of the objective lens of (1) or (2) above, the front end portion of the outer polepiece and a region in which the sample is movable may overlap each other as viewed from a direction along the optical axis.

In this objective lens, the magnetic fields produced by the first and second electromagnetic lenses can be ,better prevented from leaking to the vicinity of the sample. The magnetic field components perpendicular to the optical axis can be reduced over a wide area around the sample.

(4) In another feature of the objective lens of (1) or (2) above, the front end portion of the outer polepiece and the front end portion of the inner polepiece may overlap each other as viewed from a direction along the optical axis.

In this objective lens, the magnetic fields produced by the first and second electromagnetic lenses can be well prevented from leaking to the vicinity of the sample. Hence, the magnetic field components perpendicular to the optical axis can be reduced over a wide area around the sample.

(5) In one feature of the objective lens of any one of (1) to (4) above, there may be further included a magnetic field applicator for applying a magnetic field to the front end portion of the outer polepiece.

In this objective lens, the front end portion of the outer polepiece can be demagnetized efficiently. Consequently, the effects of the residual magnetic field can be reduced.

(6) In one feature of the objective lens of (5) above, a magnetic field lying in a direction along the optical axis may be produced on the sample placement surface by the magnetic field applicator.

In this objective lens, the magnetic field lying along the optical axis makes it possible to observe a process, for example, in which the magnetic characteristics of the sample vary.

(7) In one feature of the objective lens of any one of (1) to (6) above, there may be further included an antimagnetic cylinder which surrounds a path for introducing the sample and which blocks the magnetic fields produced by the first and second electromagnetic lenses.

In this objective lens, if a sample is introduced or taken out while the objective lens is being excited, the magnetic characteristics of the sample are affected only a little.

(8) In one feature of the objective lens of any one of (1) to (7) above, there may be further included a position adjuster for adjusting the position of at least one of the first and second electromagnetic lenses.

In this objective lens, the first and second electromagnetic lenses can be arranged accurately symmetrically with respect to a virtual plane that contains the sample placement surface.

(9) In one feature of the objective lens of (8) above, there may be further included a retainer for holding at least one of the first and second electromagnetic lenses.

In this objective lens, the electromagnetic lenses can be secured, for example, after the electromagnetic lenses are adjusted in position by the position adjuster. Consequently, the effects of external disturbances such as vibrations and sound transmitted in from outside of the transmission electron microscope can be reduced.

(10) A transmission electron microscope associated with the present invention includes an objective lens associated with the present invention.

In this transmission electron microscope, the effects of magnetic fields on a sample can be reduced. Furthermore, the microscope includes the objective lens permitting high-resolution imaging and observation. Consequently, a sample that is sensitive to magnetic fields, for example, can be observed at high resolution without varying the magnetic characteristics of the sample.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. Objective Lens
1.1. Configuration of Objective Lens

Figure 1:
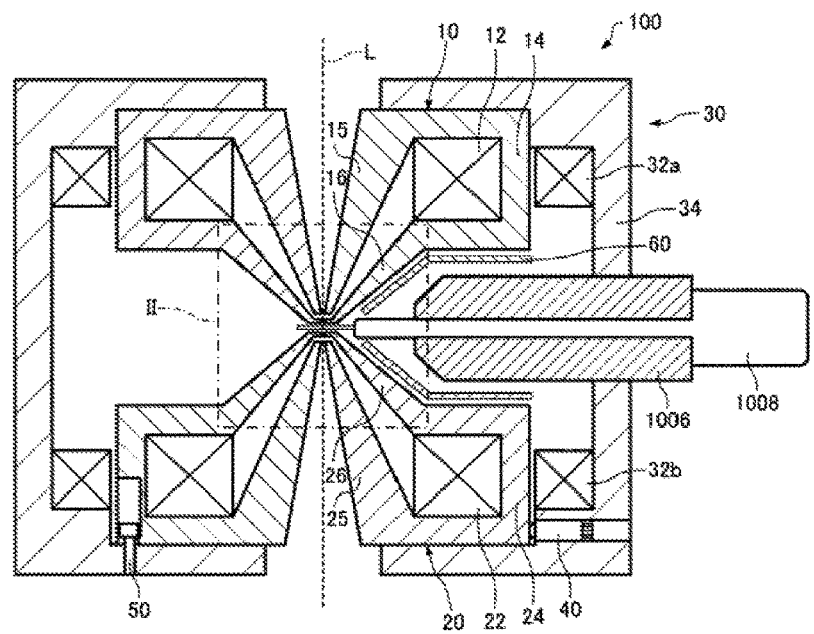
FIG. 1 is a schematic cross section of an objective lens associated with one embodiment of the present invention.
Figure 2:
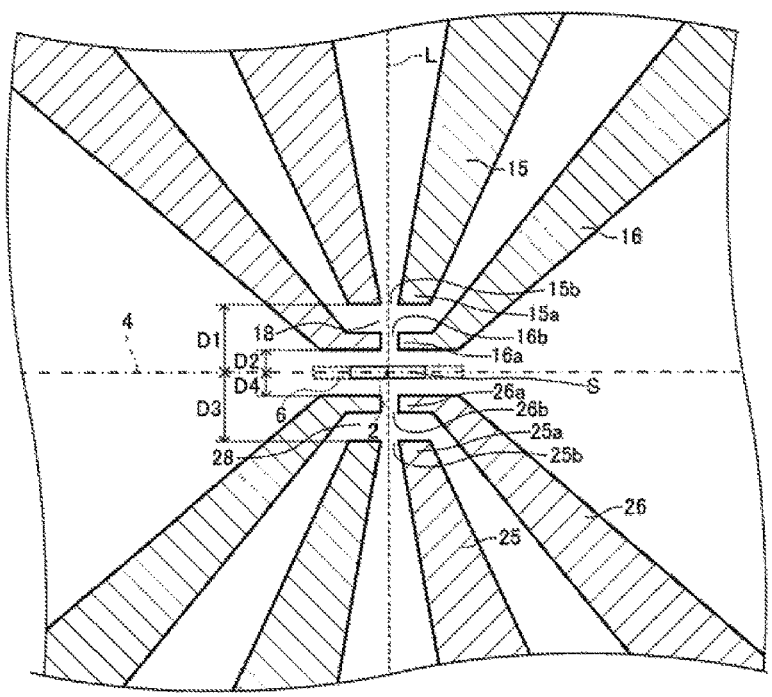
FIG. 2 is an enlarged view of the region II of FIG. 1.

The configuration of an objective lens associated with one embodiment of the present invention is first described by referring to FIGS. 1 and 2. FIG. 1 is a schematic cross section of the objective lens, 100, associated with the present embodiment, and shows a state in which a sample holder 1008 has been inserted in a sample stage (goniostage) 1006. FIG. 2 is a schematic cross section of the objective lens 100, and is an enlarged view of the region II of FIG. 1.

The objective lens 100 is for use in a transmission electron microscope and is an electromagnetic lens. As shown in FIG. 1, the objective lens 100 includes a first electromagnetic lens 10, a second electromagnetic lens 20, a magnetic field applicator 30, a position adjuster 40, a mechanical retainer 50, and an antimagnetic cylinder 60 that is impervious to magnetic fields. In FIG. 2, only the first electromagnetic lens 10 and second electromagnetic lens 20 are shown for the sake of convenience.

Figure 8:
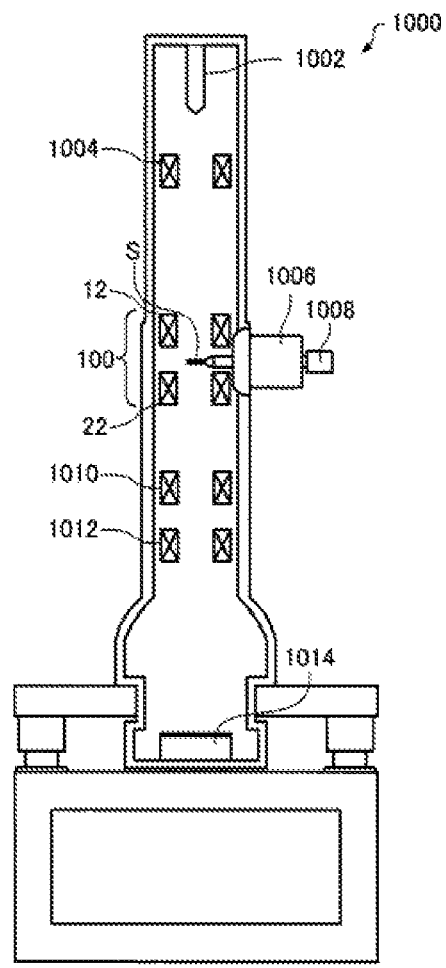
FIG. 8 is a schematic vertical cross section of a transmission electron microscope associated with another embodiment of the invention.

The first electromagnetic lens 10 and second electromagnetic lens 20 are arranged along the optical axis L of the objective lens 100. When the objective lens 100 has been incorporated in the transmission electron microscope, for example, as shown in FIG. 8, the first electromagnetic lens 10 is located above a sample placement surface 2 on which a sample is placed (i.e., on the illumination lens side), while the second electromagnetic lens 20 is located below the sample placement surface 2 (i.e., on the intermediate lens side). The first electromagnetic lens 10 and second electromagnetic lens 20 are arranged on opposite sides of the sample placement surface 2.

In the objective lens 100, a sample S is placed on the sample placement surface 2 that is located between the first electromagnetic lens 10 and the second electromagnetic lens 20. The sample placement surface 2 is a plane perpendicularly intersecting with the optical axis L. In the objective lens 100, the sample placement surface 2 provides a surface on which the sample S is placed. For example, the sample placement surface 2 is dimensioned and arranged about the position of the origin of the sample at which the optical axis and the sample placement surface intersect such that the sample S can be placed thereon. The sample stage 1006 is a side entry sample stage for inserting the sample holder 1008

(and thus the sample S) into between the first electromagnetic lens 10 and the second electromagnetic lens 20 from a horizontal direction vertical to the optical axis L.

The first electromagnetic lens 10 and second electromagnetic lens 20 are so arranged that the vertical component of the magnetic field produced by the first electromagnetic lens 10 which lies along the optical axis L and the vertical component of the magnetic field produced by the second electromagnetic lens 20 which lies along the optical axis L cancel out each other at the sample placement surface 2.

The first electromagnetic lens 10 has a first excitation coil 12 and a first magnetic yoke 14. The first excitation coil 12 is connected to a power supply (not shown). The first yoke 14 is mounted around the first excitation coil 12. The first yoke 14 has an inner polepiece 15 and an outer polepiece 16.

The inner polepiece 15 and outer polepiece 16 are annular in shape. The inner polepiece 15 is disposed on the side of the optical axis L. The outer polepiece 16 is disposed outside the inner polepiece 15. The inner polepiece 15 has a portion surrounding the first excitation coil 12. The inner polepiece 15 extends from this surrounding portion toward the sample placement surface 2. Similarly, the outer polepiece 16 has a portion surrounding the first excitation coil 12, and the outer polepiece 16 extends from this surrounding portion toward the sample placement surface 2.

The distance D2 between the front end portion 16a of the outer polepiece 16 and the sample placement surface 2 is less than the distance D1 between the front end portion 15a of the inner polepiece 15 and the sample placement surface 2. That is, the front end portion 16a of the outer polepiece 16 is located between the front end portion 15a of the inner polepiece 15 and the sample placement surface 2 as viewed in a direction along the optical axis L.

The front end portion 16a of the outer polepiece 16 juts out toward the optical axis L. That is, the front end portion 16a of the outer polepiece 16 is located closer to the optical axis L than any other portions of the outer polepiece 16.

The front end portion 16a of the outer polepiece 16 overlaps the region 6 in which the sample can move, when viewed from a direction along the optical axis L. Furthermore, the front end portion 16a of the outer polepiece 16 overlaps the front end portion 15a of the inner polepiece 15 when viewed from a direction along the optical axis L. The distance between the front end portion 15a of the inner polepiece 15 and the optical axis L is equal to the distance between the front end portion 16a of the outer polepiece 16 and the optical axis L when viewed in a direction orthogonal to the optical axis L.

In the region 6 where the sample can move, the sample S supported on the sample holder 1008 can be moved by actuation of the sample stage 1006. For example, where the diameter of the sample S is 3 mm, the sample stage 1006 can move the sample S over a distance on the order of ±1.2 mm about the position of the origin of the sample within a virtual plane 4 containing the sample placement surface 2. In this case, the region 6 where the sample can move spans from a point spaced +2.7 mm to a point spaced −2.7 mm from the position of the origin of the sample.

The front end portion 15a of the inner polepiece 15 defines an opening 15b whose center lies on the optical axis L. Similarly, the front end portion 16a of the outer polepiece 16 defines an opening 16b whose center lies on the optical axis L. The opening 15b in the inner polepiece 15 and the opening 16b in the outer polepiece 16 are circular in shape and are equal in diameter.

A gap 18 is formed between the front end portion 15a of the inner polepiece 15 and the front end portion 16a of the outer polepiece 16. The gap 18 is annular around the optical axis L. More specifically, the gap 18 is cylindrical and has a central axis on the optical axis L. In the objective lens 100, the front end portion 16a of the outer polepiece 16 juts out toward the optical axis L and so the gap 18 does not face toward the sample placement surface 2. In the illustrated example, the gap 18 faces perpendicularly to the optical axis L.

The second electromagnetic lens 20 has a second excitation coil 22 and a second magnetic yoke 24. The second excitation coil 22 is connected to a power supply (not shown). The second yoke 24 is mounted around the second excitation coil 22. The second yoke 24 has an inner polepiece 25 and an outer polepiece 26.

The inner polepiece 25 and the outer polepiece 26 are annular in shape. The inner polepiece 25 is located on the side of the optical axis L. The outer polepiece 26 is disposed outside the inner polepiece 25. The inner polepiece 25 has a portion surrounding the second excitation coil 22. The inner polepiece 25 extends from this surrounding portion toward the sample placement surface 2. Similarly, the outer polepiece 26 has a portion surrounding the second excitation coil 22, the outer polepiece 26 extending from this surrounding portion toward the sample placement surface 2.

The distance D4 between the front end portion 26a of the outer polepiece 26 and the sample placement surface 2 is less than the distance D3 between the front end portion 25a of the inner polepiece 25 and the sample placement surface 2. That is, the front end portion 26a of the outer polepiece 26 is positioned between the front end portion 25a of the inner polepiece 25 and the sample placement surface 2 as viewed in a direction along the optical axis L.

The front end portion 26a of the outer polepiece 26 juts out toward the optical axis L. That is, the front end portion 26a of the outer polepiece 26 is located closer to the optical axis L than any other portions of the outer polepiece 26.

The front end portion 26a of the outer polepiece 26 overlaps the region 6 in which the sample can move, as viewed in a direction along the optical axis L. Furthermore, the front end portion 26a of the outer polepiece 26 overlaps the front end portion 25a of the inner polepiece 25 as viewed from a direction along the optical axis L. The distance between the front end portion 25a of the inner polepiece 25 and the optical axis L is equal to the distance between the front end portion 26a of the outer polepiece 26 and the optical axis L as viewed perpendicular to the optical axis L.

The front end portion 25a of the inner polepiece 25 defines an opening 25b whose center lies on the optical axis L. Similarly, the front end portion 26a of the outer polepiece 26 defines an opening 26b whose center is located on the optical axis L. The opening 25b in the inner polepiece 25 and the opening 26b in the outer polepiece 26 are circular in shape and equal to each other in diameter.

A gap 28 is formed between the front end portion 25a of the inner polepiece 25 and the front end portion 26a of the outer polepiece 26, and is annular around the optical axis L. More specifically, the gap 28 is cylindrical and has a central axis coinciding with the optical axis L. In the objective lens 100, the front end portion 16a of the outer polepiece 16 juts out toward the optical axis L and so the gap 28 does not face toward the sample placement surface 2. In the illustrated example, the gap 28 faces perpendicularly to the optical axis L.

The first electromagnetic lens 10 and the second electromagnetic lens 20 are identical in configuration. The first electromagnetic lens 10 and the second electromagnetic lens 20 are arranged symmetrically with respect to the virtual plane 4 containing the sample placement surface 2.

The magnetic field applicator 30 has a first magnetic field applying coil 32a, a second magnetic field applying coil 32b, and a coil yoke 34 for the magnetic field applying coils.

The first magnetic field applying coil 32a is disposed outside the first excitation coil 12. The first magnetic field applying coil 32a and first excitation coil 12 are arranged, for example, coaxially. The second magnetic field applying coil 32b is disposed outside the second excitation coil 22. The second magnetic field applying coil 32b and second excitation coil 22 are arranged, for example, coaxially.

The coil yoke 34 is mounted around both the first and second magnetic field applying coils 32a, 32b. The coil yoke 34 assumes the form of a cylinder having a top surface and a bottom surface which are each provided with a circular opening about the optical axis L. The second electromagnetic lens 20 is placed on the inner bottom surface of the coil yoke 34. The first electromagnetic lens 10 is secured to the inner top surface of the coil yoke 34.

The position adjuster 40 is used to adjust the position of the second electromagnetic lens 20 placed on the coil yoke 34. For example, the position adjuster 40 is made up of position adjusting screws for pushing the second electromagnetic lens 20 in the horizontal direction perpendicular to the optical axis L. The screws can push the second electromagnetic lens 20 from different directions in a manner not illustrated. The position adjuster 40 permits adjustment of the position of the second electromagnetic lens 20 relative to the first electromagnetic lens 10. Consequently, the first electromagnetic lens 10 and the second electromagnetic lens 20 can be easily arranged symmetrically with respect to the virtual plane 4. Furthermore, in the transmission electron microscope, while the electron beam is being directed at the sample, the use of the position adjuster 40 permits an alignment of the second electromagnetic lens 20.

The retainer 50 is used to secure the second electromagnetic lens 20 to the coil yoke 34 after the lens 20 has been adjusted in position. For example, the retainer 50 is a bolt. The second electromagnetic lens 20 and the coil yoke 34 can be fastened together by screwing this bolt into an internal thread formed in the coil yoke 34.

In the illustrated example, the first electromagnetic lens 10 is fixed while the second electromagnetic lens 20 is positionally adjustable. Alternatively, the first electromagnetic lens 10 may be positionally adjustable and the second electromagnetic lens 20 may be fixed. In this case, the retainer 50 may secure the first electromagnetic lens 10 to the coil yoke 34. Furthermore, both first and second electromagnetic lenses 10, 20 may be positionally adjustable, in which case the retainer 50 may secure both first and second electromagnetic lenses 10, 20 to the coil yoke 34.

The antimagnetic cylinder 60 is disposed between the first electromagnetic lens 10 and the second electromagnetic lens 20. The cylinder 60 is mounted around a path through which the sample S is introduced from the outside into the objective lens 100. In the objective lens 100, the path for introducing the sample S is the same as the path for taking out the sample S from inside the objective lens 100.

More specifically, the antimagnetic cylinder 60 is positioned between the first electromagnetic lens 10 and the sample stage 1006 and between the second electromagnetic lens 20 and the sample stage 1006. The antimagnetic cylinder 60 is a cylindrical member having a portion whose diameter decreases in approaching the sample placement surface 2. The antimagnetic cylinder 60 is made of a high magnetic permeability such as Permalloy.

Because the antimagnetic cylinder 60 is mounted in the path for introducing the sample S, if the sample S is made of a magnetic sample that is sensitive to magnetic fields, for example, and if the sample S is entered or taken out while the objective lens 100 is magnetically excited, the magnetic characteristics of the sample S will be hardly affected.

Figure 3:
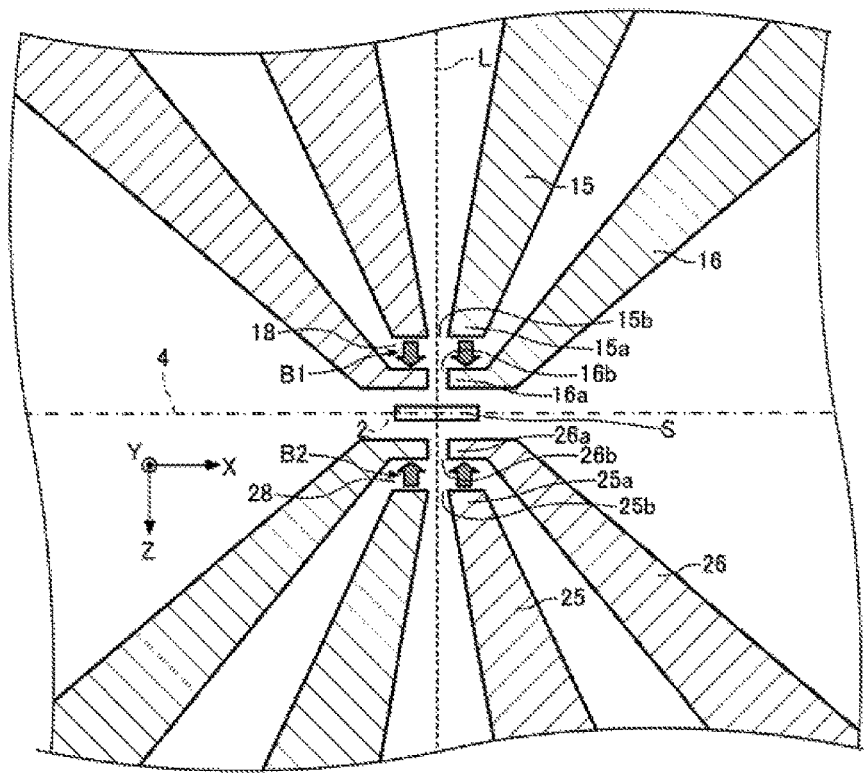
FIG. 3 is a diagram illustrating magnetic fields produced by a first electromagnetic lens and a second electromagnetic lens.

1.2. Operation of Objective Lens (1) Operation of First and Second Electromagnetic Lenses FIG. 3 is a diagram illustrating the magnetic fields produced by the first electromagnetic lens 10 and the second electromagnetic lens 20, respectively. X-, Y-, and Z-axes are shown as three axes perpendicular to each other in FIG. 3. The Z-axis extends along (parallel to) the optical axis L. The X- and Y-axes are orthogonal to the optical axis L. In the illustrated example, the Z-direction is a vertical direction. The X- and Y-directions are horizontal directions.

Figure 4:
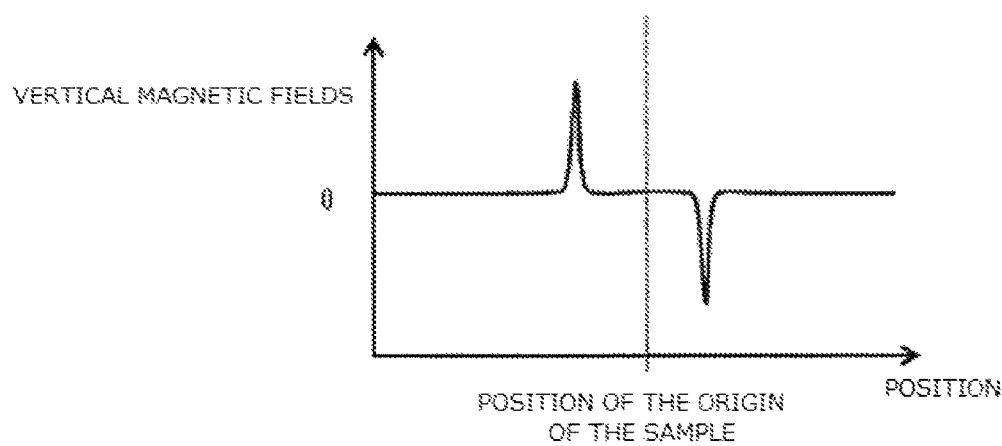
FIG. 4 is a graph illustrating a distribution of vertical magnetic fields produced by the first and second electromagnetic lenses.

FIG. 4 is a graph showing a distribution of vertical magnetic field components produced by the first electromagnetic lens 10 and second electromagnetic lens 20. In the graph of FIG. 4, the abscissa represents positions on the optical axis L and the ordinate represents the strengths of vertical magnetic field components (Z-axis components) which lie along the optical axis L of the magnetic fields.

When an excitation current is supplied from the power supply to the first excitation coil 12 of the first electromagnetic lens 10, the lens 10 generates a magnetic field B1 in front of the sample S (i.e., on the side of the illumination lens and on the negative side of the Z-direction). More specifically, when the first excitation coil 12 is supplied with the excitation current, a magnetic flux (magnetic flux path) is produced inside the first yoke 14. This magnetic flux leaks from the gap 18 between the front end portion 15a of the inner polepiece 15 and the front end portion 16a of the outer polepiece 16, resulting in the magnetic field B1 that is rotationally symmetric relative to the optical axis L. Since the front end portion 16a of the outer polepiece 16 of the first electromagnetic lens 10 juts out toward the optical axis L, the gap 18 does not face toward the sample S (toward the sample placement surface 2 or in the Z-direction). Consequently, the X and Y components of the magnetic field B1 which are vertical to the optical axis L are small over a wide area around the sample S, as well as in the position of the origin of the sample S.

Similarly, when an excitation current is supplied from the power supply to the second excitation coil 22 of the second electromagnetic lens 20, the second electromagnetic lens 20 produces a magnetic field B2 behind the sample S (i.e., on the side of the intermediate lens and on the positive side of the Z-axis). In particular, when the excitation current is supplied to the second excitation coil 22, a magnetic flux (magnetic flux path) is produced in the second yoke 24. The magnetic flux leaks from the gap 28 located between the front end portion 25a of the inner polepiece 25 and the front end portion 26a of the outer polepiece 26, producing the rotationally symmetric magnetic field B2 about the optical axis L. Because the front end portion 26a of the outer polepiece 26 of the second electromagnetic lens 20 juts out toward the optical axis L, the gap 28 does not face toward the sample S on the sample placement surface 2 or in the Z-direction. In consequence, the X and Y components of the magnetic field B2 which are perpendicular to the optical axis L are small over a wide area around the sample S, as well as in the position of the origin of the sample S.

The front end portion 16a of the outer polepiece 16 of the first electromagnetic lens 10 juts out toward the optical axis L in this way. This prevents the component of the magnetic field B1 perpendicular to the optical axis L from reaching close to the sample S. Similarly, the front end portion 26a of the outer polepiece 26 of the second electromagnetic lens 20 juts out toward the optical axis L, thus hindering the component of the magnetic field B2 perpendicular to the optical axis L from reaching close to the sample S.

As shown in FIG. 4, the Z component of the magnetic field B1 which is produced by the first electromagnetic lens 10 and which lies along the optical axis L and the Z component of the magnetic field B2 which is produced by the second electromagnetic lens 20 and which lies along the optical axis L are mutually opposite in direction. Therefore, these components of the magnetic fields B1 and B2 which lie along the optical axis L cancel out each other at the sample placement surface 2. Consequently, the strengths of the magnetic fields at the sample placement surface 2 which lie along the optical axis L can be made very small.

As described previously, the first electromagnetic lens 10 and the second electromagnetic lens 20 are identical in configuration and arranged symmetrically with respect to the virtual plane 4 containing the sample placement surface 2. Accordingly, by supplying the same excitation current to the first excitation coil 12 of the first electromagnetic lens 10 and the second excitation coil 22 of the second electromagnetic lens 20, the component of the magnetic field B1 along the optical axis L and the component of the magnetic field B2 along the optical axis L can be made equal in strength. Consequently, these two components of the magnetic fields B1 and B2 along the optical axis L can be made to cancel out each other.

In the objective lens 100, the first electromagnetic lens 10 and the second electromagnetic lens 20 can be accurately placed symmetrically with respect to the virtual plane 4 containing the sample placement surface 2 by adjusting the position of the second electromagnetic lens 20 by the use of the position adjuster 40. The second electromagnetic lens 20 whose position has been adjusted by the position adjuster 40 is secured on the coil yoke 34 by the retainer 50.

(2) Operation of Magnetic Field Applicator

Figure 5:
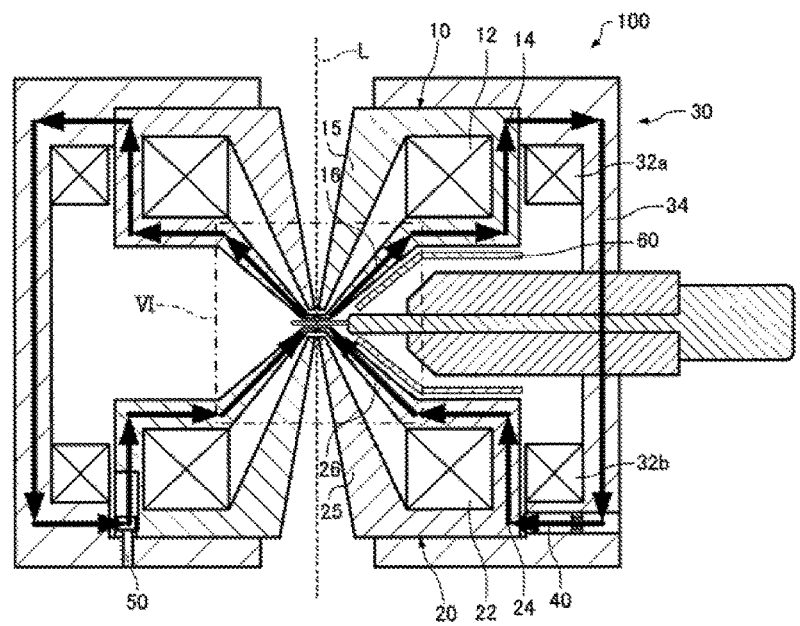
FIGS. 5 and 6 are diagrams illustrating the operation of a magnetic field generator.
Figure 6:
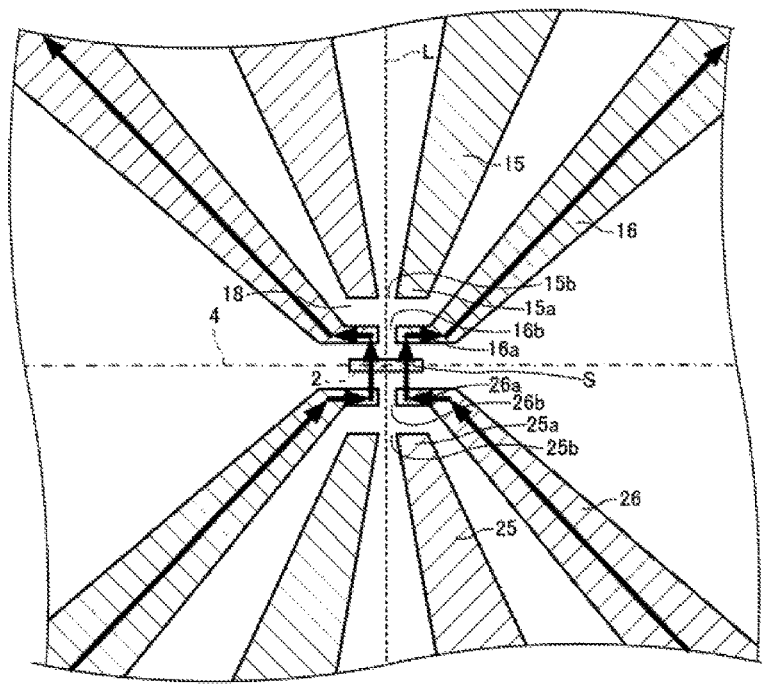

FIGS. 5 and 6 are diagrams illustrating the operation of the magnetic field applicator 30. FIG. 6 is an enlarged view of the region VI of FIG. 5. Arrows shown in FIGS. 5 and 6 indicate the magnetic flux path produced by the magnetic field applicator 30.

Generally, the polepieces of an objective lens are energized at the time of an observation or analysis. Therefore, if the level of magnetization is reduced to zero, a residual magnetic field may occur. In the objective lens 100 associated with the present embodiment, the component of the magnetic field B1 of the first electromagnetic lens 10 which lies along the optical axis L and the component of the magnetic field B2 of the second electromagnetic lens 20 which lies along the optical axis L are made opposite in direction and, therefore, the magnetic field components at the sample placement surface 2 which lie along the optical axis L are made small.

Therefore, in the objective lens 100, if residual magnetic fields occur in the polepieces 15, 16 of the first electromagnetic lens 10 and in the polepieces 25, 26 of the second electromagnetic lens 20, mutual cancellation between the component of the magnetic field B1 along the optical axis L and the component of the magnetic field B2 along the optical axis L is hindered. Consequently, the magnetic field components along the optical axis L at the sample placement surface 2 may not be reduced.

A known technique for demagnetizing the polepieces of an objective lens comprising coils along with the polepieces is disclosed, for example, in JP-A-2003-187732 and consists of producing a sinusoidal waveform that decays with time and converges to a given bias current, supplying a decaying AC current of the sinusoidal waveform to the coils, and applying a given AC magnetic field (magnetic flux) to the polepieces.

In the objective lens 100, however, if a given decaying AC current is supplied to the first excitation coil 12 of the first electromagnetic lens 10 and to the second excitation coil 22 of the second electromagnetic lens 20 for demagnetization, the front end portions 16a and 26a cannot be demagnetized efficiently because variations in the magnetic field in the front end portion 16a of the outer polepiece 16 of the first electromagnetic lens 10 and variations in the magnetic field in the front end portion 26a of the second electromagnetic lens 20 of the second electromagnetic lens 20 are quite small.

As shown in FIGS. 5 and 6, in the objective lens 100, the coil yoke 34 of the magnetic field applicator 30 permits formation of a magnetic flux path passing through the front end portion 16a of the outer polepiece 16 of the first electromagnetic lens 10 and through the front end portion 26a of the outer polepiece 26 of the second electromagnetic lens 20. Consequently, the front end portions 16a and 26a can be demagnetized efficiently.

Furthermore, in the objective lens 100, during observation of the sample S, a magnetic field in the Z-direction lying along the optical axis L can be applied to the sample S by the magnetic field applicator 30. Where the sample S is a magnetic substance, for example, a process in which the magnetic characteristics are varied by a magnetic field along the optical axis L can be observed.

The objective lens 100 has the following features. In the objective lens 100, the first electromagnetic lens 10 and the second electromagnetic lens 20 are so mounted that the component of the magnetic field B1 produced by the first electromagnetic lens 10 and lying along the optical axis L and the component of the magnetic field B2 produced by the second electromagnetic lens 20 and lying along the optical axis L cancel out each other at the sample placement surface 2. Therefore, in the objective lens 100, the strength of the Z component of the magnetic field along the optical axis L at the sample placement surface 2 can be made quite small.

Furthermore, in the objective lens 100, the distances D2 and D4 of the front end portions 16a and 26a of the outer polepieces 16 and 26, respectively, from the sample placement surface 2 are less than the distances D1 and D3 of the front end portions 15a and 25a of the inner polepieces 15 and 25, respectively, from the sample placement surface 2. The front end portions 16a and 26a of the outer polepieces 16 and 26, respectively, jut out toward the optical axis L. Therefore, in the objective lens 100, it is possible to prevent the magnetic fields produced by the first electromagnetic lens 10 and second electromagnetic lens 20 from leaking to the vicinity of the sample S. Consequently, in the objective lens 100, the X and Y components of the magnetic fields perpendicular to the optical axis L can be made small over a wide area around the sample S.

Accordingly, in the objective lens 100, the effects of magnetic fields on the sample S can be reduced. If the sample S is sensitive to magnetic fields, the sample can be observed at high resolution.

In the objective lens 100, the first electromagnetic lens 10 and the second electromagnetic lens 20 are placed symmetrically with respect to the virtual plane 4 containing the sample placement surface 2. Therefore, in the objective lens 100, the component of the magnetic field B1 produced by the first electromagnetic lens 10 lying along the optical axis L and the component of the magnetic field B2 produced by the second electromagnetic lens 20 lying along the optical axis L can be easily made to cancel out each other.

In the objective lens 100, when viewed from a direction along the optical axis L, the front end portions 16a and 26a of the outer polepieces 16 and 26 overlap the region 6 in which the sample is movable. Furthermore, when viewed from a direction along the optical axis L, the front end portions 16a and 26a of the outer polepieces 16 and 26 overlap the front end portions 15a and 25a of the inner polepieces 15 and 25. Therefore, in the objective lens 100, leakage of the magnetic fields of the first and second electromagnetic lenses 10, 20 to the vicinity of the sample S can be better prevented. Magnetic field components vertical to the optical axis L can be reduced over a wide area around the sample S.

The objective lens 100 includes the magnetic field applicator 30 for applying magnetic fields to the front end portions 16a and 26a of the outer polepieces 16 and 26. Therefore, in the objective lens 100, the front end portions 16a and 26a of the outer polepieces 16 and 26 can be effectively demagnetized. Consequently, the effects of the residual magnetic field can be reduced.

Furthermore, in the objective lens 100, a magnetic field lying along the optical axis L is produced on the sample placement surface 2 by the magnetic field applicator 30. Consequently, in the objective lens 100, a process, for example, in which the magnetic characteristics of the sample S are varied by the magnetic fields lying along the optical axis L can be observed.

The objective lens 100 includes the antimagnetic cylinder 60 which surrounds the path for introducing the sample S and which blocks the magnetic fields produced by the first electromagnetic lens 10 and second electromagnetic lens 20. Therefore, in the objective lens 100, if the sample S is introduced or taken out while the objective lens 100 is being energized, the magnetic characteristics of the sample S are affected only a little.

The objective lens 100 includes the position adjuster 40 for adjusting the position of the second electromagnetic lens 20. Therefore, in the objective lens 100, the first electromagnetic lens 10 and second electromagnetic lens 20 can be accurately arranged symmetrically with respect to the virtual plane 4. Furthermore, the objective lens 100 includes the retainer 50 for securing the second electromagnetic lens 20 and so the second electromagnetic lens 20 can be held after a positional adjustment of the second electromagnetic lens 20 using the position adjuster 40. Consequently, the effects of external disturbances such as vibrations and sound transmitted in from outside the transmission electron microscope can be diminished.

2. Modification of Objective Lens

Figure 7:
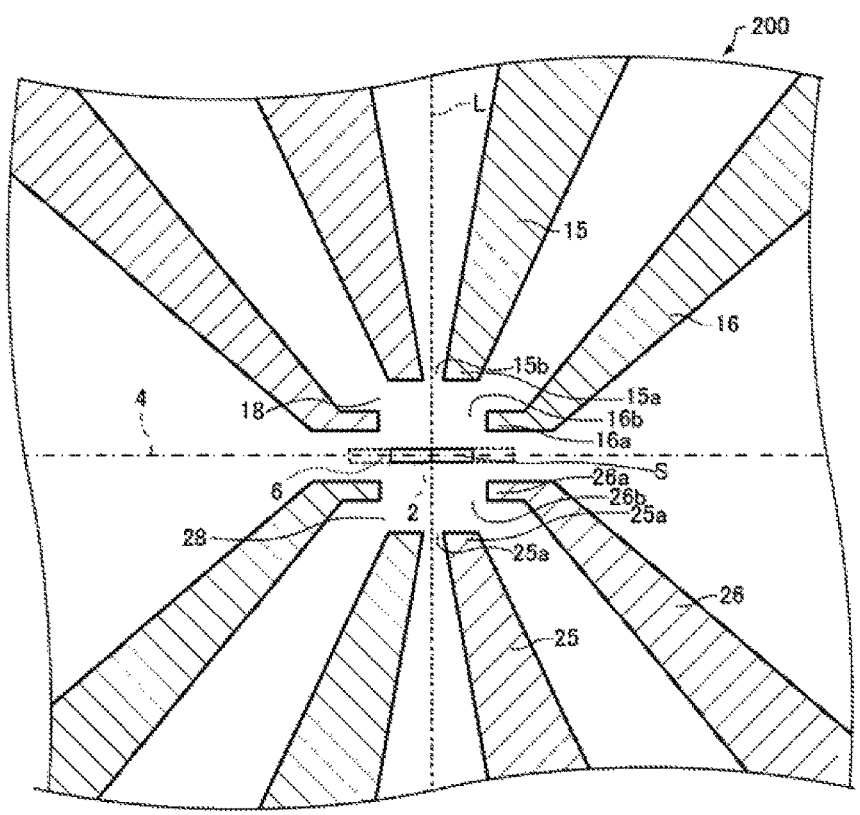
FIG. 7 is a schematic cross section of an objective lens associated with a modification of the above-described embodiment.

A modification of the objective lens 100 associated with the present embodiment is next described. FIG. 7 is a schematic cross section of the objective lens, 200, associated with the modification, and corresponds to FIG. 2. Those members of the objective lens 200 which are similar in function to their respective counterparts of the above-described objective lens 100 are indicated by the same reference numerals as in FIG. 2 and a detailed description thereof is omitted.

In the above-described objective lens 100, as shown in FIG. 2, the front end portion 16a of the outer polepiece 16 of the first electromagnetic lens 10 and the front end portion 15a of the inner polepiece 15 overlap each other as viewed from a direction along the optical axis L. Similarly, the front end portion 26a of the outer polepiece 26 of the second electromagnetic lens 20 and the front end portion 25a of the inner polepiece 25 overlap each other as viewed from a direction along the optical axis L.

On the other hand, in the objective lens 200, as shown in FIG. 7, the front end portion 16a of the outer polepiece 16 of the first electromagnetic lens 10 and the front end portion 15a of the inner polepiece 15 do not overlap one another as viewed from a direction along the optical axis L. However, in the objective lens 200, the front end portion 16a of the outer polepiece 16 of the first electromagnetic lens 10 overlaps the region 6 in which the sample is movable, as viewed from a direction along the optical axis L.

In the first electromagnetic lens 10, the distance between the front end portion 16a of the outer polepiece 16 and the optical axis L as taken perpendicularly to the optical axis L is greater than the distance between the front end portion 15b of the inner polepiece 15 and the optical axis L. Furthermore, the diameter of the opening 16b in the outer polepiece 16 is greater than that of the opening 15b in the inner polepiece 15. In addition, the opening 16b in the outer polepiece 16 is located inside the region 6 where the sample is movable, as viewed from a direction along the optical axis L.

Similarly, in the objective lens 200, the front end portion 26a of the outer polepiece 26 of the second electromagnetic lens 20 and the front end portion 25a of the inner polepiece 25 do not overlap one another as viewed from a direction along the optical axis L. However, in the objective lens 200, the front end portion 26a of the outer polepiece 26 of the second electromagnetic lens 20 overlaps the region 6 where the sample is movable, as viewed from a direction along the optical axis L.

In the second electromagnetic lens 20, when viewed in a direction perpendicular to the optical axis L, the distance between the front end portion 26a of the outer polepiece 26 and the optical axis L is greater than the distance between the front end portion 25a of the inner polepiece 25 and the optical axis L. Furthermore, the diameter of the opening 26b in the outer polepiece 26 is greater than that of the opening 25b in the inner polepiece 25. Additionally, when viewed from a direction along the optical axis L, the opening 26b in the outer polepiece 26 is located inside the region 6 where the sample is movable.

In the objective lens 200, the magnetic fields produced by the first electromagnetic lens 10 and second electromagnetic lens 20 can be prevented from leaking close to the sample S in the same way as in the objective lens 100.

The objective lens 200 prevents leakage of the magnetic fields produced by the first electromagnetic lens 10 and second electromagnetic lens 20 to the vicinity of the sample S less effectively than the objective lens 100. However, in the objective lens 200, the dimension of the sample space (where the sample S is placed) taken in the direction along the optical axis L can be extended as compared with the objective lens 100. Consequently, in the objective lens 200, the sample S can be tilted through a greater angle.

3. Transmission Electron Microscope

A transmission electron microscope associated with another embodiment is next described by referring to FIG. 8, which schematically shows the transmission electron microscope, 1000, associated with this embodiment.

The transmission electron microscope 1000 is configured including an inventive objective lens. It is here assumed that the above-described objective lens 100 constitutes this inventive objective lens included in the transmission electron microscope 1000. In FIG. 8, for the sake of convenience, the objective lens 100 and the sample stage 1006 are schematically shown.

As shown in FIG. 8, the transmission electron microscope 1000 is configured including an electron source 1002, an illumination lens system 1004, the objective lens 100, the sample stage 1006, the sample holder 1008, an intermediate lens 1010, a projector lens 1012, and an imager 1014.

The electron source 1002 produces electrons. For example, the electron source 1002 is an electron gun for accelerating electrons, emitted from a cathode, by an anode and releasing an electron beam.

The electron beam emitted from the electron source 1002 is focused onto the sample S by the illumination lens system 1004, which may be made up of a plurality of electron lenses in a manner not illustrated.

The objective lens 100 is the first stage of lens for imaging the electron beam transmitted through the sample S to create a transmission electron microscope image.

The sample stage 1006 holds the sample S. In the illustrated example, the sample stage 1006 holds the sample S via the sample holder 1008. The sample S can be placed in position by the sample stage 1006. For example, the sample stage 1006 is a goniostage (goniometer stage) capable of tilting the sample S.

The intermediate lens 1010 and projector lens 1012 together magnify the image focused by the objective lens 100 and bring the magnified image into focus onto the imager 1014. The objective lens 100, intermediate lens 1010, and projector lens 1012 together constitute an imaging system of the transmission electron microscope 1000.

The imager 1014 captures the transmission electron microscope image focused by the imaging system. For example, the imager 1014 is a digital camera such as a CCD camera or a CMOS camera.

In the transmission electron microscope 1000, the electron beam emitted from the electron source 1002 is focused onto the sample S by the illumination lens system 1004. The beam is then transmitted through the sample S and imaged by the objective lens 100. The resulting transmission electron microscope image is further magnified by the intermediate lens 1010 and projector lens 1012 and captured by the imager 1014.

The transmission electron microscope 1000 associated with the present embodiment can weaken the effects of magnetic fields on the sample S. Furthermore, the microscope includes the objective lens 100 permitting observation with high resolution. Therefore, if the sample S is a magnetic sample, for example, that is sensitive to magnetic fields, the sample can be observed at high resolution without varying its magnetic characteristics.

It is to be understood that the present invention is not restricted to the foregoing embodiments and that the invention can be practiced in variously modified forms without departing from the gist of the invention.

In the above embodiments, the first electromagnetic lens 10 and the second electromagnetic lens 20 are identical in configuration and arranged symmetrically with respect to the virtual plane 4. The objective lens associated with the present invention is not restricted to this structure.

For example, the component of the magnetic field B1 lying along the optical axis L and the component of the magnetic field B2 lying along the optical axis L may be made to cancel out each other by making the first electromagnetic lens 10 and the second electromagnetic lens 20 different in configuration and adjusting the excitation currents supplied to the first excitation coil 12 and to the second excitation coil 22. Furthermore, the component of the magnetic field B1 lying along the optical axis L and the component of the magnetic field B2 lying along the optical axis L may be made to cancel out each other by arranging the first electromagnetic lens 10 and the second electromagnetic lens 20 asymmetrically with respect to the virtual plane 4 and adjusting the excitation currents supplied to the first excitation coil 12 and to the second excitation coil 22.

It is to be noted that the above-described embodiments and modification are merely exemplary and that the invention is not restricted thereto. For example, the embodiments and modification may be appropriately combined.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described our invention with the detail and particularity required by the Patent Laws, what is desired protected by Letters Patent is set forth in the following claims.

The invention claimed is:

1. An objective lens for use in a transmission electron microscope, comprising:
   a first electromagnetic lens and a second electromagnetic lens arranged along an optical axis and on opposite sides of a sample placement surface on which a sample is placed, the first and second electromagnetic lenses producing their respective magnetic fields having components lying along the optical axis;
   a magnetic field applicator comprising a first magnetic field applying coil, a second magnetic field applying coil, and a coil yoke mounted around both the first and second magnetic field applying coils, wherein the first magnetic field applying coil is disposed outside a first excitation coil of the first electromagnetic lens and the second magnetic field applying coil is disposed outside a second excitation coil of the second electromagnetic lens; and
   said first electromagnetic lens and said second electromagnetic lens being so arranged that the component of the magnetic field of the first electromagnetic lens lying along the optical axis and the component of the magnetic field of the second electromagnetic lens lying along the optical axis in a direction opposite the component of the magnetic field of the first electromagnetic lens, cancel out each other at the sample placement surface,
   wherein each of the first electromagnetic lens and the second electromagnetic lens has an inner polepiece and an outer polepiece, the inner polepiece having a front end portion, the outer polepiece having a front end portion that juts out toward the optical axis,
   wherein a distance between the front end portion of the outer polepiece and the sample placement surface is less than a distance between the front end portion of the inner polepiece and the sample placement surface, wherein the coil yoke of the magnetic field applicator is configured to cause a magnetic flux path to be formed passing through the front end portion of the outer polepiece of the first electromagnetic lens and through the front end portion of the outer polepiece of the second electromagnetic lens, and wherein the front end portion of the outer polepiece of the first electromagnetic lens and the front end portion of the outer polepiece of the second electromagnetic lens are demagnetized.

2. The objective lens as set forth in claim 1, wherein said first electromagnetic lens and said second electromagnetic lens are arranged symmetrically with respect to a virtual plane that contains said sample placement surface.

3. The objective lens as set forth in claim 1, wherein the front end portion of said outer polepiece of the first electromagnetic lens or the front end portion of said outer polepiece of the second electromagnetic lens and a region in which the sample is movable based on actuation of a sample stage overlap each other as viewed from a direction along said optical axis.

4. The objective lens as set forth in claim 1, wherein the front end portion of said outer polepiece of the first electromagnetic lens and the front end portion of said inner polepiece of the first electromagnetic lens or the front end portion of said outer polepiece of the second electromagnetic lens and the front end portion of said inner polepiece of the second electromagnetic lens overlap each other as viewed from a direction along said optical axis.

5. The objective lens as set forth in claim 1, further comprising an antimagnetic cylinder which surrounds a path for introducing said sample and which blocks the magnetic fields produced by said first electromagnetic lens and said second electromagnetic lens.

6. The objective lens as set forth in claim 1, further comprising a position adjuster for adjusting the position of at least one of said first electromagnetic lens and said second electromagnetic lens.

7. The objective lens as set forth in claim 6, further comprising a retainer for holding at least one of said first electromagnetic lens and said second electromagnetic lens.

8. The objective lens as set forth in claim 1, wherein the magnetic field applicator is configured to apply a magnetic field to the front end portion of said outer polepiece of the first electromagnetic lens or the front end portion of said outer polepiece of the second electromagnetic lens.

9. The objective lens as set forth in claim 8, wherein a second magnetic field lying in a direction along said optical axis is produced on said sample placement surface by the magnetic field applicator.

10. An objective lens for use in a transmission electron microscope, comprising:

a first electromagnetic lens and a second electromagnetic lens arranged along an optical axis and on opposite sides of a sample placement surface on which a sample is placed, the first and second electromagnetic lenses producing their respective magnetic fields having components lying along the optical axis;

said first electromagnetic lens and said second electromagnetic lens being so arranged that the component of the magnetic field of the first electromagnetic lens lying along the optical axis and the component of the magnetic field of the second electromagnetic lens lying along the optical axis in a direction opposite the component of the magnetic field of the first electromagnetic lens, cancel out each other at the sample placement surface, wherein each of the first electromagnetic lens and the second electromagnetic lens has an inner polepiece and an outer polepiece, the inner polepiece having a front end portion, the outer polepiece having a front end portion that juts out toward the optical axis, wherein a distance between the front end portion of the outer polepiece and the sample placement surface is less than a distance between the front end portion of the inner polepiece and the sample placement surface; and a magnetic field applicator for applying a magnetic field to the front end portion of said outer polepiece of the first electromagnetic lens or the front end portion of said outer polepiece of the second electromagnetic lens.

11. The objective lens as set forth in claim 10, wherein a second magnetic field lying in a direction along said optical axis is produced on said sample placement surface by said magnetic field applicator.

12. A transmission electron microscope comprising:

an electron source that produces an electron beam;

an illumination lens system that focuses the electron beam on a sample;

an objective lens that receives electrons transmitted through the sample to create a transmission electron microscope image;

an intermediate lens and a projector lens that create a magnified transmission electron microscope image; and an image detector that detects the magnified transmission electron image, wherein the objective lens comprises a first electromagnetic lens and a second electromagnetic lens arranged along an optical axis and on opposite sides of a sample placement plane and symmetrically with respect to the sample placement plane, wherein the first electromagnetic lens has an inner polepiece and an outer polepiece, the inner polepiece and the outer polepiece of the first electromagnetic lens being annular in shape, surrounding the optical axis, and extending toward the sample placement plane, wherein the second electromagnetic lens has an inner polepiece and an outer polepiece, the inner polepiece and the outer polepiece of the second electromagnetic lens being annular in shape, surrounding the optical axis, and extending toward the sample placement plane, wherein a distance between a front end portion of the outer polepiece of the first electromagnetic lens and the sample placement plane is less than a distance between a front end portion of the inner polepiece of the first electromagnetic lens and the sample placement plane, wherein a distance between a front end portion of the outer polepiece of the second electromagnetic lens and the sample placement plane is less than a distance between a front end portion of the inner polepiece of the second electromagnetic lens and the sample placement plane, wherein the front end portion of the inner polepiece of the first electromagnetic lens forms a first opening at a position across the optical axis, wherein the front end portion of the outer polepiece of the first electromagnetic lens forms a first bottom surface extending along the sample placement plane and forms a second opening at a position across the optical axis, wherein the front end portion of the inner polepiece of the second electromagnetic lens forms a third opening at a position across the optical axis, wherein the front end portion of the outer polepiece of the second electromagnetic lens forms a second bottom surface extending along the sample placement plane and forms a fourth opening at a position across the optical axis, wherein the first electromagnetic lens produces a first magnetic field within a gap between the first opening of the inner polepiece of the first electromagnetic lens and the second opening of the outer polepiece of the first electromagnetic lens, wherein the second electromagnetic lens produces a second magnetic field within a gap between the third opening of the inner polepiece of the second electromagnetic lens and the fourth opening of the outer polepiece of the second electromagnetic lens, and wherein the first and second magnetic fields have components lying along the optical axis and surrounding the optical axis and said components being opposite in direction and are substantially equal in magnitude.

13. The transmission electron microscope according to claim 12, wherein a diameter of the first opening and a diameter of the second opening are substantially the same.

14. The transmission electron microscope according to claim 12, wherein a diameter of the third opening and a diameter of the fourth opening are substantially the same.

* * * * *